(12) United States Patent
Arita et al.

(10) Patent No.: US 6,418,941 B1
(45) Date of Patent: Jul. 16, 2002

(54) METHOD OF AND APPARATUS FOR PLASMA CLEANING OF CHIP-MOUNTED BOARD

(75) Inventors: Kiyoshi Arita, Fukuoka-ken; Tanemasa Asano, Munakata, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/165,149

(22) Filed: Oct. 2, 1998

(30) Foreign Application Priority Data

Oct. 7, 1997 (JP) ............................................. 9-274147

(51) Int. Cl.$^7$ ................................................. C23F 1/00
(52) U.S. Cl. ........................... 134/1.2; 134/21; 216/12; 216/13; 216/45; 216/75; 156/345
(58) Field of Search ...................... 134/1.2, 21; 216/12, 216/13, 45, 75; 156/345

(56) References Cited

U.S. PATENT DOCUMENTS

| | | | | |
|---|---|---|---|---|
| 4,112,196 A | * | 9/1978 | Selig et al. .................. | 428/594 |
| 4,337,476 A | * | 6/1982 | Fraser et al. .................. | 357/67 |
| 5,129,142 A | * | 7/1992 | Bindra et al. .................. | 29/852 |
| 5,250,843 A | * | 10/1993 | Eichelberger et al. ...... | 257/692 |
| 5,644,247 A | * | 7/1997 | Hyun et al. .................. | 324/755 |

\* cited by examiner

*Primary Examiner*—Anita Alanko
*Assistant Examiner*—Allan Olsen
(74) *Attorney, Agent, or Firm*—Stevens, Davis, Miller & Mosher, LLP

(57) ABSTRACT

There is disclosed a method of the plasma cleaning of a chip-mounted board, in which the destruction of a chip due to the charge build-up in a land during the plasma cleaning is prevented. There is provided a mask member for covering a board placed on a plasma-generating electrode. This mask member has openings through which the chip, mounted on the land on the board, and electrodes on the board are exposed, respectively, and an exposed portion of the land, extending outwardly of the chip, and a conducting portion on the board are covered with the mask member. A high-frequency voltage is applied to the plasma-generating electrode, thereby producing plasm within a vacuum chamber, so that ions $Ar^+$ impinge on pads on the chip to clean and charge up these pads. The land is covered with the mask member, and therefore will not be charged up with the ions $Ar^+$ and electrons $e^-$. Therefore, the potential difference between the pads and the chip will not become large, and therefore a large charge build-up current is prevented from flowing through the chip, thereby preventing the destruction of the chip.

7 Claims, 6 Drawing Sheets

0mm²

30mm²

100mm²

170mm²

METHOD OF AND APPARATUS FOR PLASMA CLEANING OF CHIP-MOUNTED BOARD

BACKGROUND OF THE INVENTION

1. Field of the Invention

This invention relates to a method of the plasma cleaning of a chip-mounted board, which method is carried out before a wire bonding operation in which pads of a chip are connected respectively to electrodes of the board by wires. The invention also relates to apparatus for performing this method.

2. Related Art

There is known a technique in which the plasma cleaning of a board is carried out before a wire bonding operation in which pads of a semiconductor integrated circuit chip (hereinafter referred to merely as "chip"), mounted on the board, are connected respectively to electrodes of the board by wires. In the plasma cleaning, the board is received within a vacuum chamber, and a high-frequency voltage is applied to a plasma-generating electrode provided in the vacuum chamber so as to produce ions of positive charge and electrons of negative charge, and these ions and electrons are caused to impinge on the pads on an upper surface of the chip and the electrodes on the board, thereby cleaning these pads and electrodes. When the pads and the electrodes are thus cleaned, the wire bonding ability thereof is enhanced, and the wires can be firmly bonded to the pads and the electrodes.

However, when the above plasma cleaning of the board is carried out, a transistor structure portion within the chip is liable to be destroyed. The cause of this destruction has not yet been known, and this is one of the reasons why the plasma cleaning has not been extensively used. The present invention has been made in the process of clearing up the cause of this chip destruction, and the cause of the chip destruction, cleared up by the inventors of the present invention, will be explained in the following.

FIG. 5 is a cross-sectional view of an essential portion of a conventional apparatus for the plasma cleaning of a board. In this Figure, reference numeral 1 denotes the board to be subjected to the plasma cleaning. A land 2 is formed at a central portion of an upper surface of the board 1, and electrodes 3 are formed on the upper surface of the board 1, and are disposed around the land 2. A chip 4 is adhesively bonded to an upper surface of the land 2 by a bond (adhesive) 6. Pads 5 are formed on an upper surface of the chip 4. The pads 5 are connected respectively to the electrodes 3 by wires in a later wire bonding step. The pads 5 and the electrodes 3 are subjected to a plasma cleaning treatment so as to enhance the wire bonding ability.

The bond 6 is formed by mixing powder of metal, such as Ag, into an epoxy resin. After this board 1 is completed, it is incorporated into an electronic equipment, and when an electric current is caused to flow through the chip 4, heat is generated because of an internal resistance of the chip 4. Therefore, the bond 6 contains the powder of metal having good thermal conductivity, such as Ag, so that the heat, generated by the chip 4, can be transferred to the land 2 through the bond 6.

The board 1 is placed on a plate-like, plasma-generating electrode 7. A cover member 8 is provided to cover the plasma-generating electrode 7, and a vacuum chamber 9 is defined by the cover member 8 and the electrode 7. An AC power source 10 is connected to the plasma-generating electrode 7 so as to apply a high-frequency voltage to this electrode. The cover 8 is connected to a grounding portion 11. The vacuum chamber 9 is evacuated to a vacuum by vacuum evacuation means, and plasma-generating gas, such as argon (Ar) gas, is supplied into the vacuum chamber 9.

Next, the plasma cleaning operation will be described. The board 1 is placed on the plasma-generating electrode 7, and the vacuum chamber 9 is evacuated to a vacuum by the vacuum evacuation means, and then Ar gas is supplied into the vacuum chamber 9. Then, the AC power source 10 is driven to apply a high-frequency voltage to the electrode 7. As a result, the interior of the vacuum chamber 9 is in a plasma condition, and ions $Ar^+$ of positive charge and electrons $e^-$ of negative charge are produced within the vacuum chamber 9. The ions $Ar^+$ and the electrons $e^-$ impinge on the electrodes 3 of the board 1 and the pads 5 of the chip 4, thereby cleaning the electrodes 3 and the pads 5.

The board 1 is placed on a central portion of the plasma-generating electrode 7, and therefore a peripheral portion of this electrode 7 is not covered with the board 1, and is exposed to the vacuum chamber 9. On the other hand, the high voltage having a high frequency is applied to the electrode 7, so that the electrode 7 varies between a positive potential and a negative potential at a high frequency. As a result, the motion of the electrons $e^-$ becomes quite vigorous at the peripheral portion of the electrode 7. In FIG. 5, broken-line arrows a show the electrons $e^-$ vigorously moving at the peripheral portion of the electrode 7 which is not covered with the board 1. And besides, those electrons $e^-$, which are present at the central portion of the vacuum chamber 9 above the chip 4, avoid the board 1, and move toward the peripheral portion of the vacuum chamber 9 (as indicated by broken-line arrows b), and make a vigorous motion as indicated by the broken-line arrows a.

Because of the above phenomenon, the amount of the ions $Ar^+$ of positive charge relatively increases at the central portion A of the vacuum chamber 9 while the amount of the electrons $e^-$ of negative charge relatively increases at the peripheral portion B of the vacuum chamber 9. Namely, the distribution of the positive ions and the electrons within the vacuum chamber 9 becomes uneven. Therefore, the pads 5 of the chip 4, located at the central portion A of the vacuum chamber 9, are liable to be electrically positively charged while the electrodes 3 of the board 1 are liable to be electrically negatively charged.

With respect to the destruction of the chip, it is important to note that the land 2 is negatively charged with the electrons $e^-$. More specifically, as shown in FIG. 5, the land 2 is much larger in size than the chip 4, and a peripheral portion C of the land 2 is extending outwardly of the chip 4, and is exposed, and the electrons $e^-$ impinge on this extending portion of the land 2 in a larger amount than the positive ions do, so that the land 2 is electrically negatively charged. On the other hand, the pads 5 of the chip 4 are positively charged as described above, and therefore a large potential difference occurs between the pads 5 and the land 2. However, since the chip 4 is adhesively bonded to the land 2 by the electrically-conductive paste 6, a large potential difference occurs between the pads 5 and the chip 4, and as a result, a charge build-up current flows through a transistor structure portion, formed within the chip 4, so that the transistor structure portion is destroyed by this current.

Next, explanation will be made of the relation between the size of the area of the extending (exposed) portion of the land 2, extending outwardly of the chip 4, and the potential difference between the pads 5 and the transistor structure portion. FIGS. 6A to 6D are plan views showing various examples of chip-land arrangements, respectively. More specifically, in FIG. 6A, a chip 4 and a land 2 are equal in area to each other, and the land 2 does not extend outwardly of the chip 4 at all (The extension area is 0 mm²). In FIG. 6B, the area of an extending, exposed portion of a land 2, extending outwardly of a chip 4, is relatively small (The extension area is 30 mm²). In FIG. 6C, a chip 4 has a relatively small size, and the area of an extending, exposed portion of a land 2, extending outwardly of the chip 4, is relatively large (The extension area is 100 mm²). The arrangement of FIG. 6D differs from the arrangement of FIG. 6C only in that a conducting portion 12 is connected to a land 2. This conducting portion 12 serves as a plating electrode when forming a circuit pattern, including the land 2 and electrodes 3, by plating means, and is commonly provided in a circuit board for the electronic devices. In this case, the conducting portion 12 is electrically connected to the land 2, and therefore the substantial extension area of the land 2 is the actual extension area thereof plus the area of the conducting portion 12 (The extension area is 170 mm²).

FIG. 7 is a graph showing a relation between the exposure area (extension area) of the land and the potential difference between the pads and the land. The four arrangements, shown respectively in FIGS. 6A to 6D, were subjected to plasma cleaning under the same conditions (A power of the high-frequency power source was 500 W, the pressure within the vacuum chamber was 6 Pa, and the plasm cleaning time was 1 minute), and the potential difference between the pads 5 and the chip 4 in each of the above arrangements was measured, and these results are shown in FIG. 7. In the case of FIG. 6A, the potential difference is 2.4 V, and in the case of FIG. 6B, the potential difference is 5.3 V, and in the case of FIG. 6C, the potential difference was 5.8 V, and in the case of FIG. 6D, the potential difference is 6.2 V.

As is clear from FIG. 7, the larger the exposure (extension) area, extending outwardly of the chip 4, is, the larger the potential difference between the pads 5 and the chip 4 is, and therefore with the increase of this potential difference, a larger charge build-up current flows, thereby increasing the possibility of the chip destruction. The upper limit of the potential difference, at which the chip destruction occurs, varies depending on the kinds of chips, but generally, when the potential difference exceeds 5 V, the possibility of the chip destruction abruptly increases. It has been found through experiments by the inventors of the present invention that particularly those chips, having MOS transistors, are liable to be destroyed.

From the foregoing, the inventors of the present invention has found the following facts (1) and (2):

(1) The cause of the chip destruction during the plasma cleaning is that the distribution of the ions of positive charge and the electrons of negative charge, produced within the vacuum chamber during the plasma cleaning, is not uniform, so that the pads of the chip are positively charged while the land, on which the chip is mounted, is negatively charged, with the result that an excess charge build-up current flows through the transistor structure portion in the chip.

(2) The potential difference between the pads and the chip is generally proportional to the area of the extending, exposed portion, extending outwardly of the chip, plus the area of the conducting portion connected to the land.

SUMMARY OF THE INVENTION

It is therefore an object of this invention to provide a method of the plasma cleaning of a chip-mounted board, in which the destruction of a chip due to the charge build-up in a land during the plasma cleaning is prevented.

Another object of the invention is to provide apparatus for performing this plasma-cleaning method.

According to one aspect of the present invention, a mask member, having openings, is superposed on a board received within a vacuum chamber, in such a manner that an exposed portion of a land, extending outwardly of a chip, and a conducting portion, connected to the land, are covered with the mask member, with the chip and electrodes of the board exposed respectively through the openings. In this condition, a voltage is applied to a plasma-generating electrode so as to produce ions of positive charge and electrons of negative charge within the vacuum chamber, so that the ions and the electrons impinge on pads of the chip and the electrodes of the board in such a manner that the electrons impinge on the electrodes of the board in a relatively larger amount than the ions do, thereby cleaning the pads and the electrodes.

According to another aspect of the invention, a chip is adhesively mounted on a land with an electrically-insulating paste, and a voltage is applied to a plasma-generating electrode so as to produce ions of positive charge and electrons of negative charge within a vacuum chamber, so that the ions and the electrons impinge on pads of the chip and the electrodes of the board in such a manner that the electrons impinge on the electrodes of the board in a relatively larger amount than the ions do, thereby cleaning the pads and the electrodes.

With the above construction of the present invention, the exposed portion of the land, extending outwardly of the chip, is prevented from being negatively charged up with the electrons, or the chip and the land are electrically insulated from each other. By doing so, a large charge build-up current is prevented from flowing through the chip during the plasma cleaning, thereby preventing the chip from being destroyed.

DESCRIPTION OF THE PREFERRED EMBODIMENTS

Figure 1:
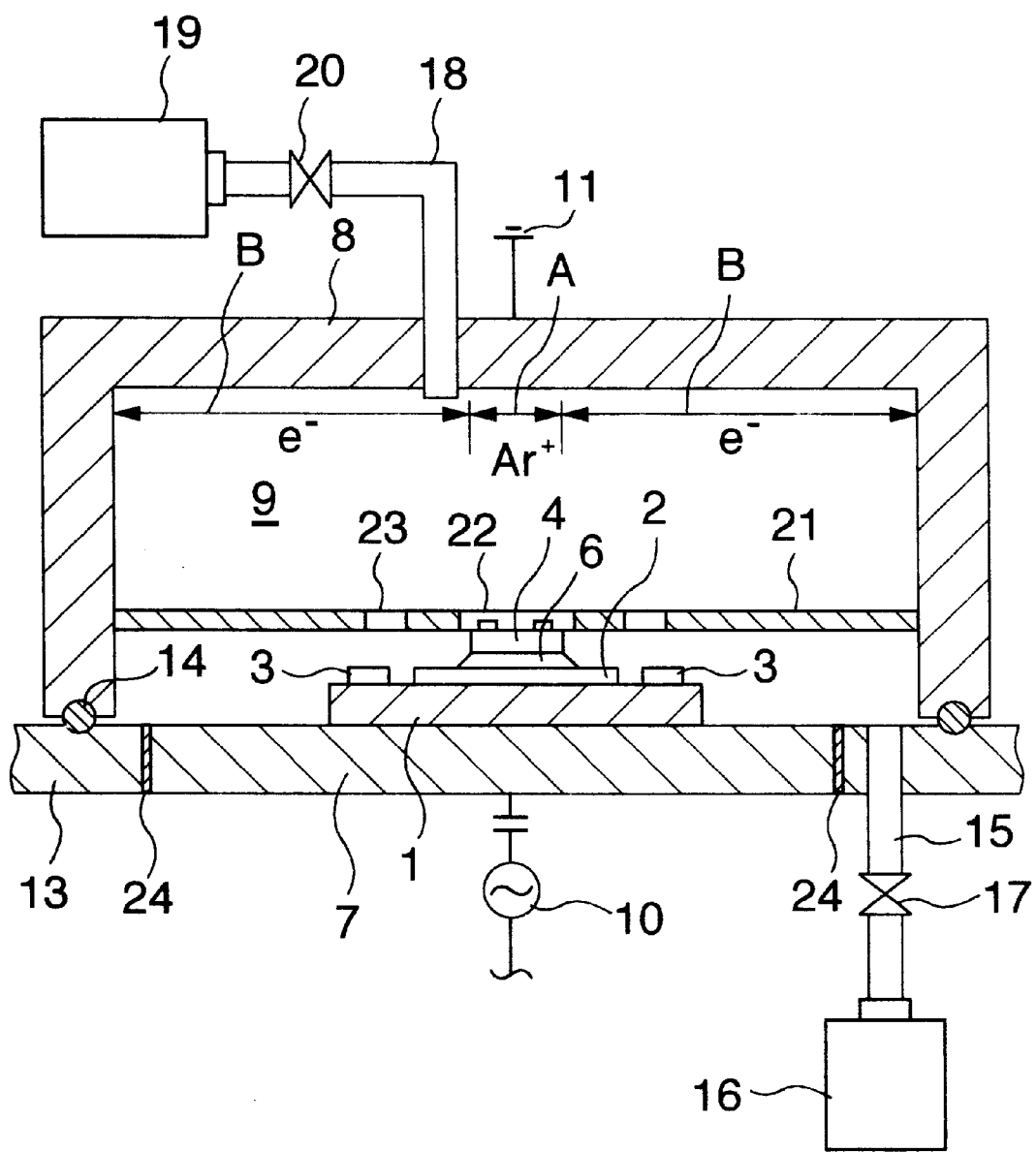
FIG. 1 is a cross-sectional view of a first embodiment of a board-plasma cleaning apparatus according to the present invention.
Figure 2:
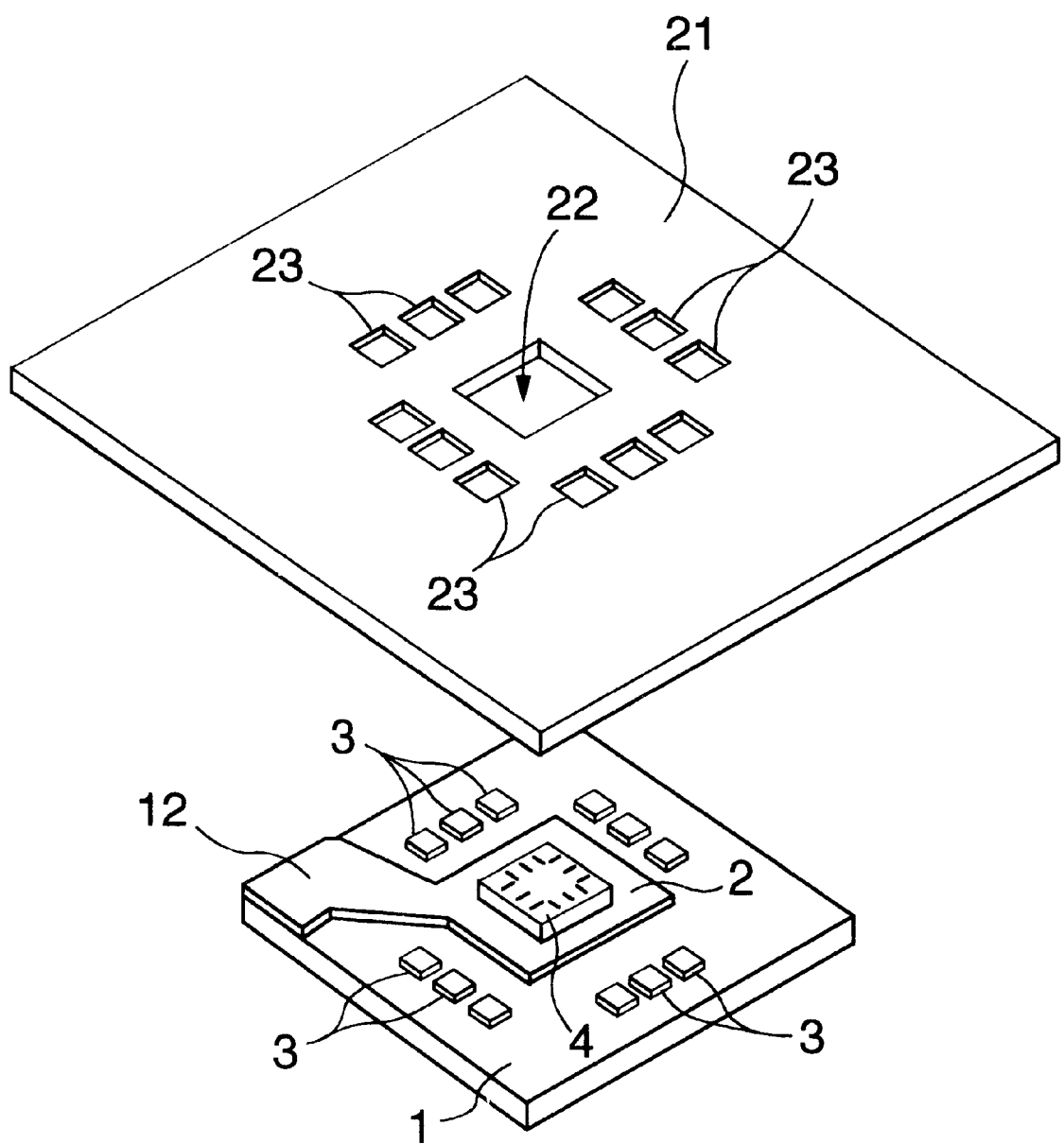
FIG. 2 is a perspective view showing a chip-mounted board and a mask member in the first embodiment.
Figure 3:
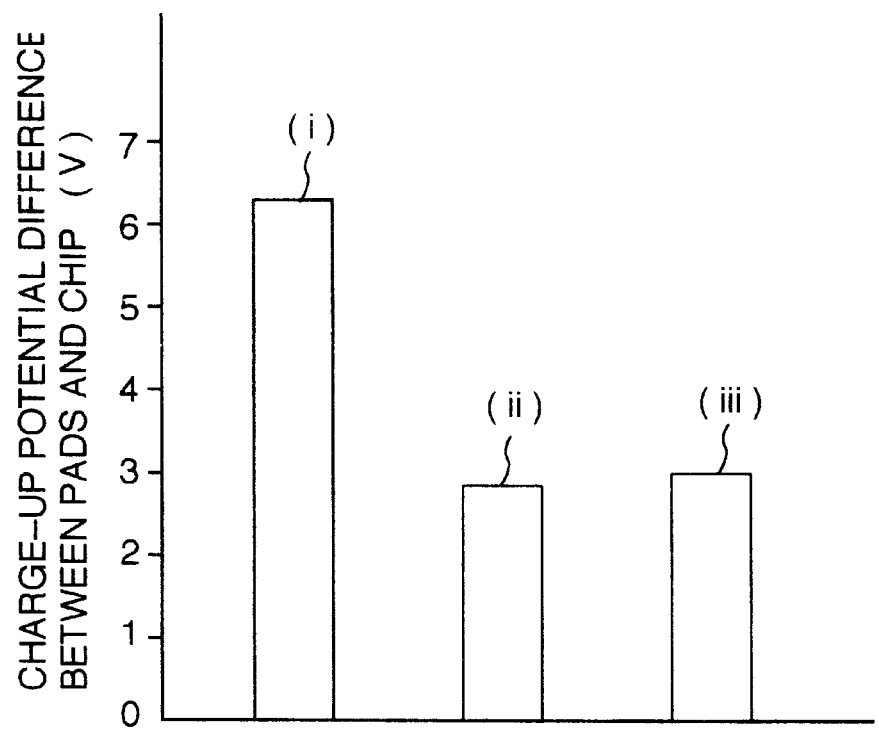
FIG. 3 is a graph showing the magnitude of charge build-up potential differences in the first embodiment.
Figure 5:
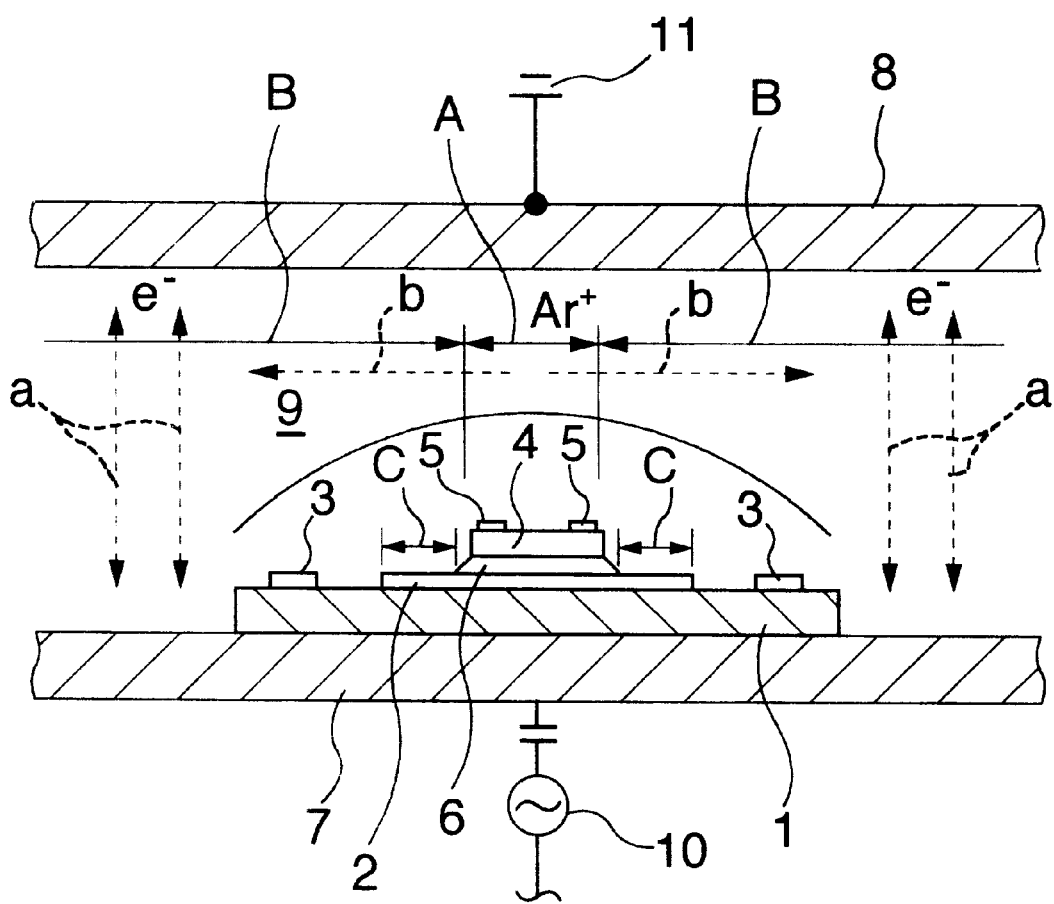
FIG. 5 is a cross-sectional view of an essential portion of a conventional board-plasma cleaning apparatus.
Figure 6A:
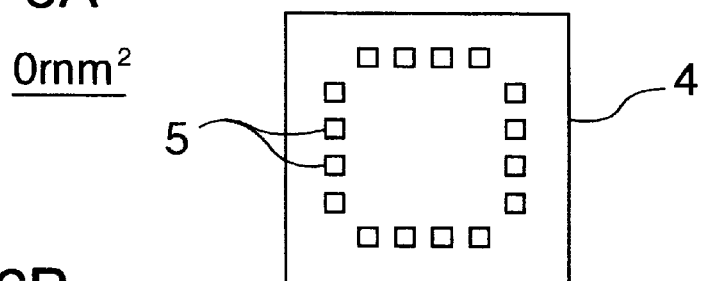
FIGS. 6A to 6D are plan views showing various examples of chip-land arrangements, respectively.
Figure 6B:
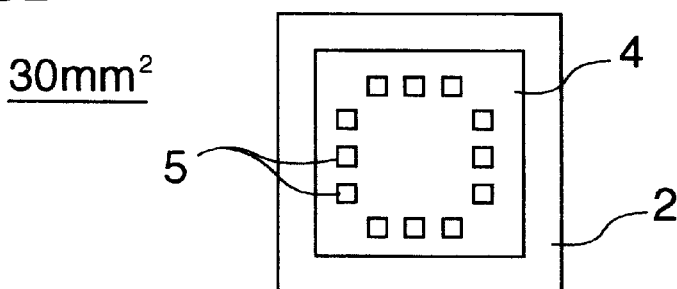
Figure 6C:
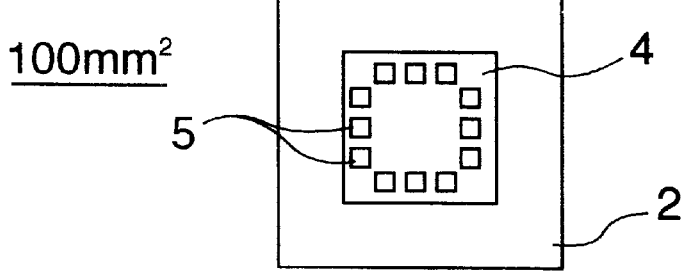
Figure 6D:
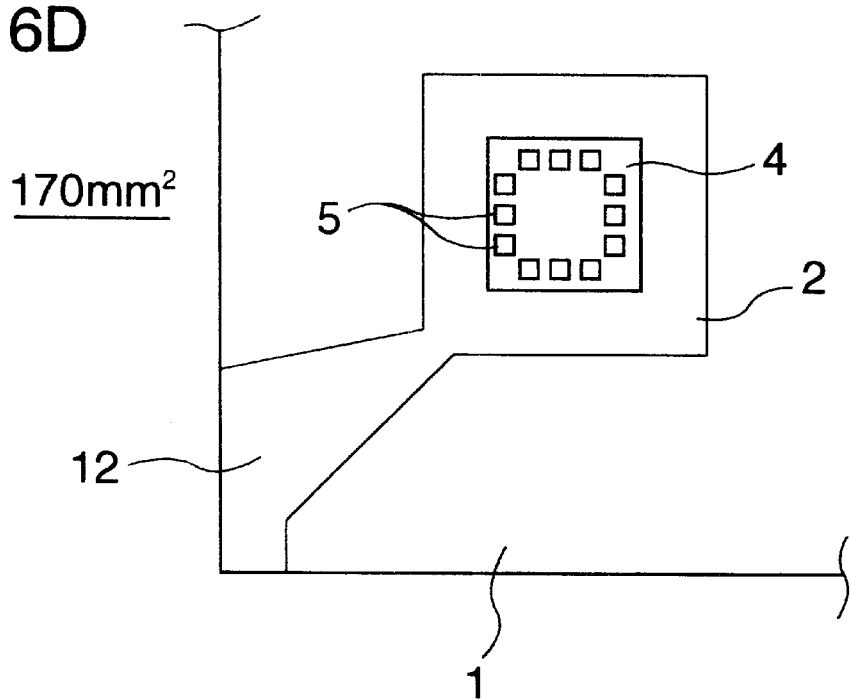
Figure 7:
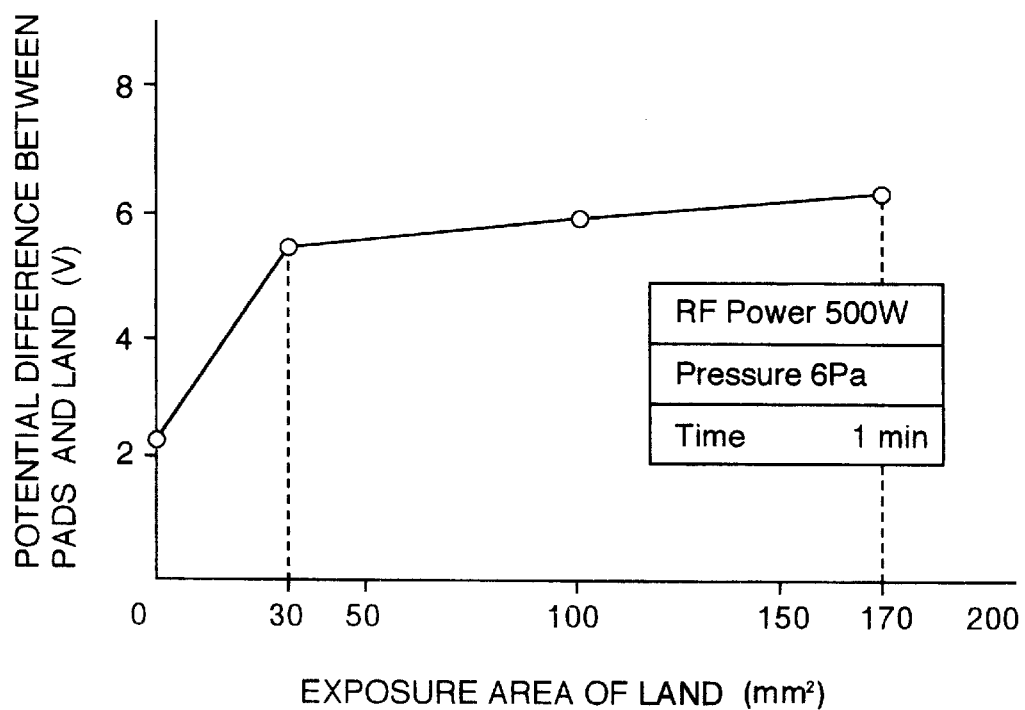
FIG. 7 is a graph showing a relation between an exposure area (extension area) of a land and a potential difference between pads and the land.

FIG. 1 is a cross-sectional view of a first embodiment of a board-plasma cleaning apparatus according to the present invention, FIG. 2 is a perspective view showing a chip-mounted board and a mask member, and FIG. 3 is a graph showing the magnitude of charge build-up potential differences. Those elements identical to those of the conventional construction of FIG. 5 will be designated by identical reference numerals, respectively.

First, the construction of the board-plasma cleaning apparatus will be described with reference to FIG. 1. A plasma-generating electrode 7 is mounted on a base member 13 through an insulating member 24, and a box-shaped cover member 8 is removably mounted on the base member 13. The base member 13 and the cover member 8 are joined or connected together in a sealed manner through a seal 14. A high-frequency AC power source 10 is connected to the electrode 7, and the cover member 8 is connected to a grounding portion 11.

The board 1 is placed on the electrode 7. In FIGS. 1 and 2, a chip 4 is adhesively mounted on a land 2, which is formed on a central portion of an upper surface of the board 1, by a paste (adhesive) 6, and electrodes 3 are formed on the upper surface of the board 1, and are disposed around the land 2. A conducting portion 12 is formed at one corner portion of the board 1, and is connected to the land 2.

In FIG. 1, a pipe 15 is fitted in a hole formed through the base member 13, and vacuum evacuation means 16 is connected to the pipe 15. A vacuum chamber 9 is evacuated to a vacuum by opening a valve 17, and the evacuation is stopped by closing the valve 17. A pipe 18 is fitted in a hole formed through the cover member 8. Plasma-generating gas supply means 19 is connected to the pipe 18, and a plasma-generating gas, such as Ar gas, is supplied into the vacuum chamber 9 by opening a valve 20.

In FIGS. 1 and 2, the board 1 is covered with the mask member 21. The mask member 21 is made of an electrically-insulating plate, and has an opening 22 and openings 23 formed therethrough, and the chip 4 on the board 1 is exposed through the opening 22, and the electrodes 3 on the board 1 are exposed respectively through the openings 23.

In the above construction, the vacuum chamber 9 is evacuated to a vacuum by the vacuum evacuation means 16, and the plasma-generating gas, such as Ar gas, is supplied into the vacuum chamber 9, and a high-frequency voltage is applied to the electrode 7. As a result, ions, such as $Ar^+$, and electrons $e^-$ are produced within the vacuum chamber 9.

As described above with reference to FIG. 5, when the distribution of the ions and the electrons within the vacuum chamber 9 is not uniform, the amount of the ions $Ar^+$ relatively increases at a central portion A of the vacuum chamber 9 above the chip 4 while the amount of the electrons $e^-$ of negative charge relatively increases at a peripheral portion B of the vacuum chamber 9. Therefore, the ions $Ar^+$ impinge on the upper surface of the chip 4, exposed through the opening 22, in a relatively larger amount than the electrons $e^-$ do, thereby cleaning pads 5 on the chip 4, and also charge build-up occurs in the pads 5. Also, the electrons $e^-$ impinge on the electrodes 3, exposed respectively through the openings 23, in a relatively larger amount than the ions $Ar^+$ do, thereby cleaning the electrodes 3. On the other hand, that portion (i.e., peripheral portion) of the land 2, extending outwardly of the chip 4, is covered with the mask member 21, and therefore the ions $Ar^+$ and the electrons $e^-$ hardly impinge on this extending portion, so that the charge build-up in the land 2 is suppressed. Therefore, the potential difference between the pads 5 and the land 2 will not become so large.

FIG. 3 shows results of measurement of the charge build-up potential differences between the pads 5 and the chip 4. In FIG. 3, (i) represents the potential difference obtained when the mask member 21 was not used, and in this case the potential difference was more than 6 V. (ii) represents the potential difference obtained when the mask member 21 was used, and in this case the potential difference was slightly less than 3 V. As described above, generally, when the potential difference is not more than 5 V, there is almost no possibility of the chip destruction, and therefore with this method of the present invention, the chip destruction problem can be overcome substantially perfectly.

Figure 4:
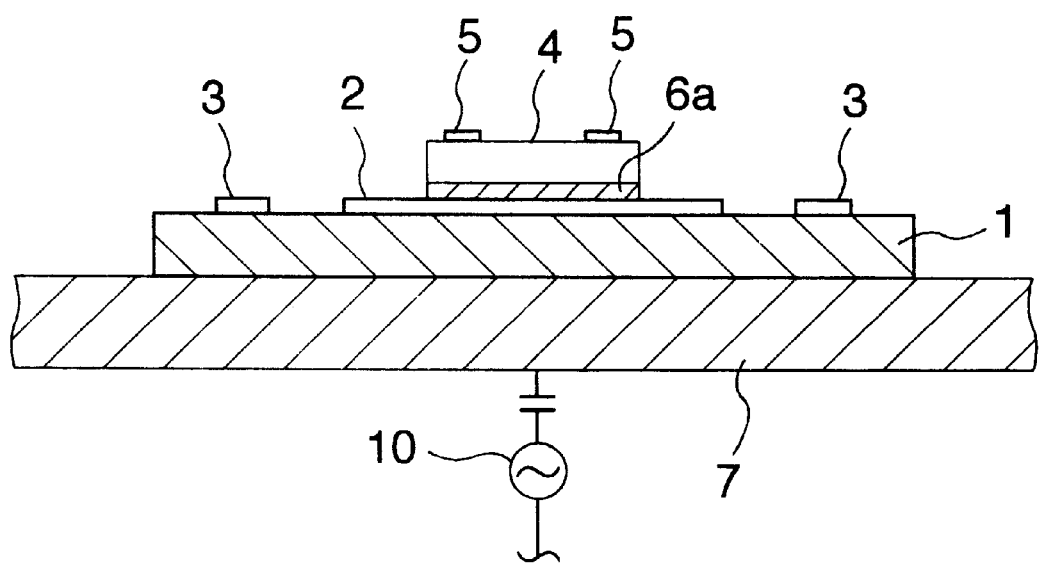
FIG. 4 is a cross-sectional view showing a board during the plasma cleaning according to a second embodiment of the invention.

FIG. 4 is a cross-sectional view showing a board during the plasma cleaning according to a second embodiment of the invention. In this embodiment, the mask member 21 is not used, and a chip 4 is adhesively bonded to a land 2 of the board 1 by an electrically-insulating paste (adhesive) 6a. This paste 6a is composed of an epoxy resin or the like, and in order to secure the electrically-insulating property, powder of metal, such as Ag, is not mixed into the epoxy resin. The other construction is the same as that of FIG. 1.

As described above for the first embodiment, the board 1 is received within the vacuum chamber 9, and the plasma cleaning is carried out. As a result, charge build-up occurs in pads 5 of the chip 4 with ions $Ar^+$. A peripheral portion of the land 2 is exposed, that is, not covered with the chip 4, and therefore charge build-up occurs in the land 2 with electrons $e^-$. Therefore, the potential difference between the pads 5 and the land 2 becomes large, but since the chip 4 is electrically insulated from the land 2 by the electrically-insulating paste 6a, the charge build-up between the pads 5 and the chip 4 is suppressed, so that the chip 4 will not be destroyed. In FIG. 3, (iii) represents the potential difference between the pads 5 and the chip 4 obtained in this case, and its magnitude is generally the same as that of (ii).

As described above, in the present invention, the negative charge build-up is prevented from occurring in the exposed portion of the land, extending outwardly of the chip, with the electrons, or the chip and the land are electrically insulated from each other. By doing so, the chip is prevented from being destroyed during the plasma cleaning.

What is claimed is:

1. A method of the plasma cleaning of a chip-mounted board including a land formed on a central portion of an upper surface of the board, a chip mounted on an upper surface of the land, and electrodes formed on the upper surface of the board and disposed around the land, wherein the chip has pads formed on an upper surface thereof, and the land has an exposed portion extending outwardly of the chip, and a conducting portion is formed on the upper surface of the board, and is connected to the exposed portion of the land, said method comprising the steps of:

superposing a mask member, having openings, on said board, received within a vacuum chamber, in such a manner that said exposed portion of said land and said conducting portion are covered with said mask member, with said chip and said electrodes exposed respectively through said openings; and subsequently applying a voltage to a plasma-generating electrode so as to produce ions of positive charge and electrons of negative charge within said vacuum chamber, so that said ions and said electrons impinge on said pads and said electrodes on said board, thereby cleaning said pads and said electrodes.

2. A method of the plasma cleaning of a chip-mounted board including a land formed on a central portion of an upper surface of the board, a chip mounted on an upper surface of the land, and electrodes formed on the upper surface of the board and disposed around the land, said chip having pads formed on an upper surface thereof, and said method comprising the steps of:

adhesively mounting said chip on said land with an electrically-insulating paste; and applying a voltage to a plasma-generating electrode so as to produce ions of positive charge and electrons of negative charge within a vacuum chamber, in which said board is received, so that said ions and said electrons impinge on said pads and said electrodes on said board, thereby cleaning said pads and said electrodes.

3. Apparatus for the plasma cleaning of a chip-mounted board including a land formed on a central portion of an upper surface of the board, a chip mounted on an upper surface of the land, and electrodes formed on the upper surface of the board and disposed around the land, wherein the chip has pads formed on an upper surface thereof, and the land has an exposed portion extending outwardly of the chip, and a conducting portion is formed on the upper surface of the board, and is connected to the exposed portion of the land, said apparatus comprising:

a base member;

a plasma-generating electrode mounted on said base member through an electrically-insulating member, said plasma-generating electrode being connected to an AC power source;

a cover member which is removably mounted on said base member, and is connected to a grounding portion, said cover member being joined to said base member in a sealed manner through a seal to define, together with said base member, a vacuum chamber;

vacuum evacuation means for evacuating said vacuum chamber to a vacuum;

plasma gas supply means for supplying plasma-generating gas to said vacuum chamber; and a mask member having openings, said mask member being superposed on said board received within said vacuum chamber, in such a manner that said exposed portion of said land and said conducting portion are covered with said mask member, with said chip and said electrodes exposed respectively through said openings.

4. Apparatus according to claim 3, in which said mask member is provided within said cover member.

5. Apparatus according to claim 3, in which said mask member comprises an electrically-insulating plate.

6. Apparatus according to claim 4, in which said mask member comprises an electrically-insulating plate.

7. Apparatus for the plasma cleaning of a chip-mounted board having a chip mounted on a land formed on a central portion of an upper surface of the board, wherein the board is received within a vacuum chamber, and gas, supplied into the vacuum chamber is formed into plasma, and ions of this gas are caused to impinge on the chip and electrodes on the board, said apparatus comprising:

a mask member for preventing said ions from impinging on an exposed portion of said land, extending outwardly of said chip, and a conducting portion which is formed on the upper surface of said board, and is connected to said exposed portion.

* * * * *